(12) United States Patent
Tsorng et al.

(10) Patent No.: US 11,882,658 B2
(45) Date of Patent: Jan. 23, 2024

(54) PRINTED CIRCUIT BOARD SYSTEM

(71) Applicant: Quanta Computer Inc., Taoyuan (TW)

(72) Inventors: Yaw-Tzorng Tsorng, Taoyuan (TW); Tung-Hsien Wu, Taoyuan (TW); Wei-Jie Chen, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 17/647,484

(22) Filed: Jan. 10, 2022

(65) Prior Publication Data

US 2023/0225053 A1 Jul. 13, 2023

(51) Int. Cl.
*H05K 1/14* (2006.01)
*H01R 12/71* (2011.01)
*H05K 1/02* (2006.01)
*H05K 7/14* (2006.01)

(52) U.S. Cl.
CPC .......... *H05K 1/141* (2013.01); *H01R 12/716* (2013.01); *H05K 1/0298* (2013.01); *H05K 7/1421* (2013.01); *H05K 1/14* (2013.01)

(58) Field of Classification Search
CPC .. H05K 5/0026; H05K 7/1421; H05K 7/1422; H05K 2201/042; H05K 2201/044; H05K 2201/145; H05K 1/141; H05K 1/0298; H05K 1/144; H05K 2201/1031; H05K 2201/041; H01R 12/716; H01R 12/52; G06F 1/185

See application file for complete search history.

(56) References Cited

U.S. PATENT DOCUMENTS

| | | | | |
|---|---|---|---|---|
| 4,764,122 A * | 8/1988 | Sorel | ............... | H01R 12/724 439/74 |
| 5,269,693 A * | 12/1993 | Sekine | ............... | H01R 12/00 29/830 |
| 5,825,630 A * | 10/1998 | Taylor | ............... | H05K 7/023 361/791 |
| 6,392,142 B1 * | 5/2002 | Uzuka | ............... | H05K 7/1445 174/541 |
| 6,731,515 B2 * | 5/2004 | Rhoads | ............... | H05K 7/1444 361/796 |
| 8,054,645 B2 * | 11/2011 | Ikeda | ............... | H05K 7/1461 361/802 |
| 2002/0006026 A1 * | 1/2002 | Takahashi | ............... | H05K 7/1425 361/725 |
| 2003/0007339 A1 * | 1/2003 | Harris | ............... | H05K 7/1457 361/788 |
| 2008/0055875 A1 * | 3/2008 | Berke | ............... | H05K 7/1487 361/800 |
| 2009/0186494 A1 * | 7/2009 | Bell, Jr. | ............... | G06F 13/409 439/65 |
| 2011/0117754 A1 * | 5/2011 | Hirano | ............... | H05K 7/1445 439/62 |
| 2012/0190219 A1 * | 7/2012 | Pai | ............... | H01R 12/721 439/65 |

* cited by examiner

*Primary Examiner* — Steven T Sawyer
(74) *Attorney, Agent, or Firm* — NIXON PEABODY LLP

(57) ABSTRACT

A printed circuit board system includes a plurality of printed circuit board (PCB) assemblies that includes at least three PCB assemblies and a connecting module. The connecting module is coupled to each of the PCB assemblies. The connecting module is adapted to provide electrical and signal communications between each of the PCB assemblies. The connecting module is on different planes with respect to at least one of the PCB assemblies.

14 Claims, 9 Drawing Sheets

PRINTED CIRCUIT BOARD SYSTEM

FIELD OF THE INVENTION

The present disclosure relates generally to a printed circuit board system for information technology (IT) systems. More particularly, aspects of this disclosure relate to a printed circuit board system that is an improvement in communications and servicing of the same.

BACKGROUND OF THE INVENTION

Computer components, such as servers, include numerous electronic components that need to communicate with each other. One type of electronic component that is used in servers are printed circuit board assemblies. The printed circuit board assemblies need to communicate with each other. Existing techniques for linking the signals between two printed circuit boards include the use of cables or a linking board. These existing techniques become very difficult to link all of the signals between three or more printed circuit board assemblies.

Thus, there is a need for a printed circuit board system that overcomes such problems.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to one aspect of the present disclosure, a printed circuit board system includes a plurality of printed circuit board (PCB) assemblies that includes at least three PCB assemblies, and a connecting module. The connecting module is coupled to each of the PCB assemblies. The connecting module is adapted to provide electrical and signal communications between each of the PCB assemblies. The connecting module is on different planes with respect to at least one of the PCB assemblies.

According to a configuration of the above implementation, the plurality of PCB assemblies is at least four PCB assemblies.

According to another configuration of the above implementation, the plurality of PCB assemblies is from about 3 to about 10 PCB assemblies. In another embodiment, the plurality of PCB assemblies is from about 3 to about 6 PCB assemblies.

In a further implementation, at least one length of the plurality of PCB assemblies is different from the other length or lengths of the plurality of PCB assemblies In yet another implementation, the plurality of PCB assemblies includes an input/output board, a mother board, a power distribution board, and a graphics processing unit In one implementation, the connecting module is formed from at least two pieces. In another implementation, the connecting module is formed from at least three pieces.

According to another aspect of the present disclosure, a computer system includes a housing and at least one tray contained within the housing. The tray includes a plurality of printed circuit board (PCB) assemblies that includes at least three PCB assemblies, and a connecting module coupled to each of the PCB assemblies. The connecting module is adapted to provide electrical and signal communications between each of the PCB assemblies. The connecting module is on different planes with respect to at least one of the PCB assemblies.

In a further aspect of the above implementation, the computer system is a server.

According to a configuration of the above implementation, the plurality of PCB assemblies is from about 3 to about 10 PCB assemblies.

According to another configuration of the above implementation, at least one length of the plurality of PCB assemblies is different from the other length or lengths of the plurality of PCB assemblies.

In a further implementation, the plurality of PCB assemblies includes an input/output board, a mother board, a power distribution board, and a graphics processing unit In yet another implementation, the connecting module is formed from at least two pieces. In another implementation, the connecting module is formed from at least three pieces.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

Figure 1A:
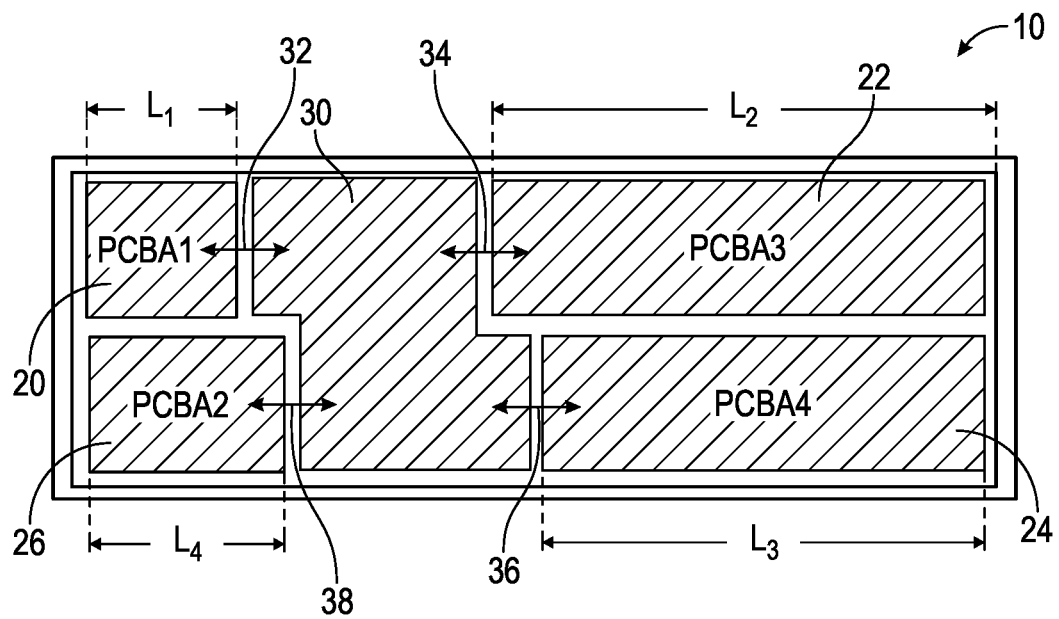
FIG. 1A is a schematic side view of a printed circuit board system, according to one embodiment.

According to one aspect of the present disclosure, a printed circuit board system includes a plurality of printed circuit board (PCB) assemblies that includes at least three PCB assemblies, and a connecting module. The connecting module is coupled to each of the PCB assemblies. The connecting module is adapted to provide electrical and signal communications between each of the PCB assemblies. The connecting module is on different planes with respect to at least one of the PCB assemblies.

The printed circuit board system is used with information technology (IT) systems. Non-limiting examples of information technology (IT) systems include, but are not limited to, servers, computer systems, network switches, stand-alone computers, or storage units (e.g., just a bunch of disks (JBOD)). In one embodiment, a server includes memory, a processor, a cooling fan, a power supply, heat syncs, and a chassis.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Figure 1B:
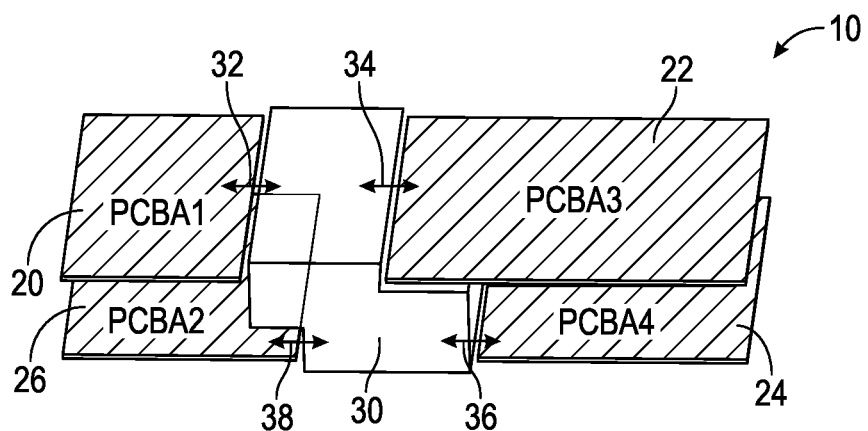
FIG. 1B is an isometric view of the printed circuit board system of FIG. 1A.

Referring to FIGS. 1A, 1B, views of a printed circuit board assembly 10 are shown according to one embodiment. The printed circuit board assembly 10 includes a plurality of printed circuit board assemblies (PCBA) 20, 22, 24 and 26, and a connecting module 30. The printed circuit board assemblies are also referred to as PCB assemblies. The connecting module 30 is adapted to provide electrical and signal communications between each of the plurality of printed circuit board assemblies 20, 22, 24 and 26. The connections between the plurality of printed circuit board assemblies (PCBA) 20, 22, 24 and 26, and the connecting module 30 are accomplished by connections 32, 34, 36, 38 that provide the signal routes as shown in FIGS. 1A, 1B.

It is contemplated that the number of printed circuit board assemblies may vary from that shown in FIG. 1A. In one embodiment, the printed circuit board system includes at least three printed circuit board assemblies. It is contemplated that the printed circuit board system includes at least four or at least five printed circuit board assemblies. The number of printed circuit board assemblies is generally from about 3 to about 10 and, more typically, is from about 3 to about 6 printed circuit board assemblies that are include in the printed circuit board system.

The types of printed circuit board assemblies that may be used in the printed circuit board system can vary. In one non-limiting embodiment (FIGS. 1A, 1B), the printed circuit board assembly 20 is an input/output board. The input/output board allows communications between the printed circuit board assemblies and external components. More specifically, the input/output board is the bridge from the other printed circuit board assemblies (i.e., printed circuit board assemblies 22, 24 and 26 of FIGS. 1A, 1B) to external components (e.g., external server or switch). The input/output board has connectors for connecting with the connecting module 30 and also has connectors for an open commute card (OCP) card or other network cards.

The printed circuit board assembly 22 is a graphics processing unit (GPU) board that is a computing center. The graphics processing unit has connectors for connecting with the connecting module 30, or connecting with the connecting module 30 via an adapter board. One non-limiting example of a graphic processing unit board that may be used is a NVIDIA HGX-series GPU board. It is contemplated that other graphics processing unit boards may be used.

Referring still to FIGS. 1A, 1B the printed circuit board assembly 24 is a mother board. The mother board assists in processing and controlling of the printed circuit board assemblies. The mother board includes components such a baseboard management controller (BMC), memory, network interfaces, central processing unit (CPU), dual in-line memory module (DIMM), and connectors for connecting with the connecting module 30.

The printed circuit board assembly 26 is a power distribution board (PDB). The power distribution board distributes the power to all of the printed circuit board assemblies. The power distribution board includes connectors for docking with a power supply unit (PSU) that converts mains AC to low-voltage DC power for the internal components of a computer. The power distribution board also includes connectors for connecting with the connecting module 30.

As shown in FIGS. 1A, 1B the lengths L1-L4 of each of the plurality of printed circuit board assemblies 20, 22, 24, 28, respectively, are different. Thus, the lengths of the printed circuit board assemblies 20, 22, 24, 28 do not need to be the same to be connected with the connecting module 30. It is contemplated, however, that some or all of the lengths of the printed circuit board assemblies may be the same.

It is contemplated that other types of printed circuit board assemblies may be used other than the printed circuit board assemblies 20, 22, 24, 28 described above. For example, the printed circuit board assemblies may be a hard disk drive (HDD) board, a switch board, or a fan board.

Each of the plurality of printed circuit board assemblies 20, 22, 24, 26 is connected to the connecting module 30. The connecting module 30 is adapted to provide electrical and signal communications between each of the plurality of printed circuit board assemblies 20, 22, 24, 26. The connecting module 30 has fixed connections that are releasable with each of the printed circuit board assemblies 20, 22, 24, 26.

Figure 1C:
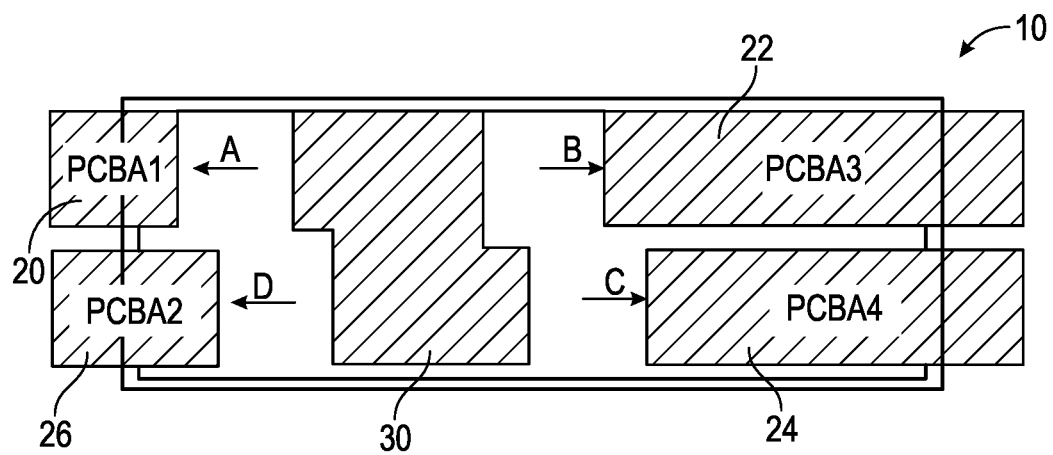
FIG. 1C is a schematic side view of the printed circuit board system of FIG. 1A depicting the directions of release.
Figure 1D:
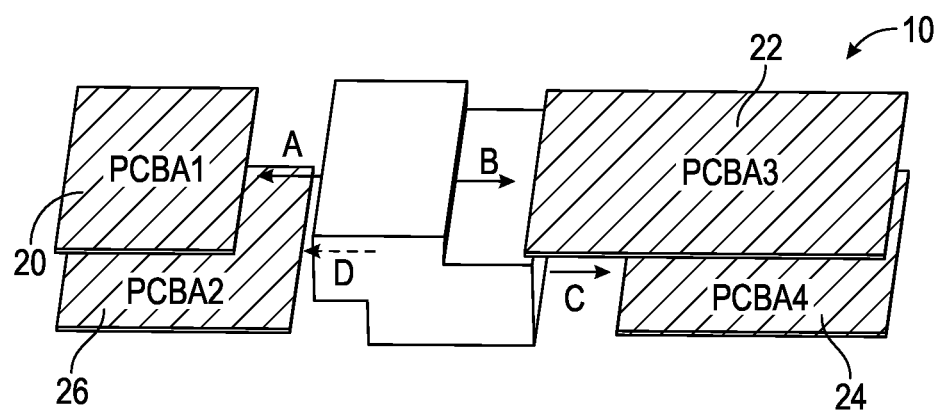
FIG. 1D is an isometric view of the printed circuit board system of FIG. 1C depicting the directions of release.

Referring to FIGS. 1C, 1D, the releasing of the plurality of printed circuit board assemblies 20, 22, 24, 26 from the connecting module 30 is shown with respective arrows A, B, C, D. The arrows A-D show the respective directions of release between the connecting module 30 and the printed circuit board assemblies 20, 22, 24 and 26.

Figure 2A:
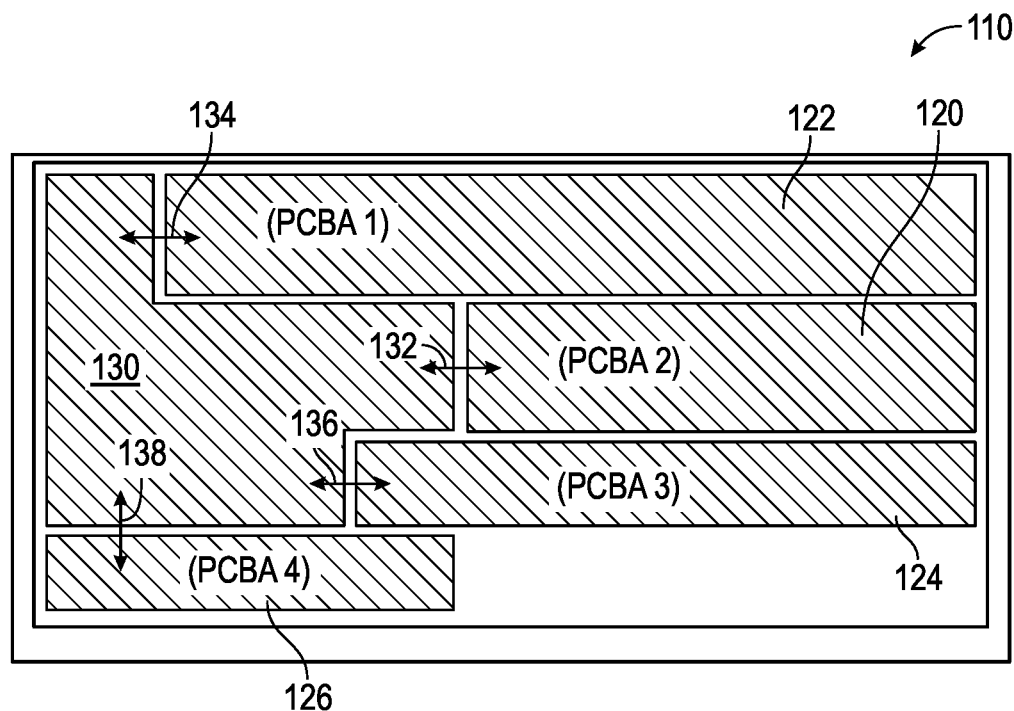
FIG. 2A is a schematic side view of a printed circuit board system, according to another embodiment.
Figure 2B:
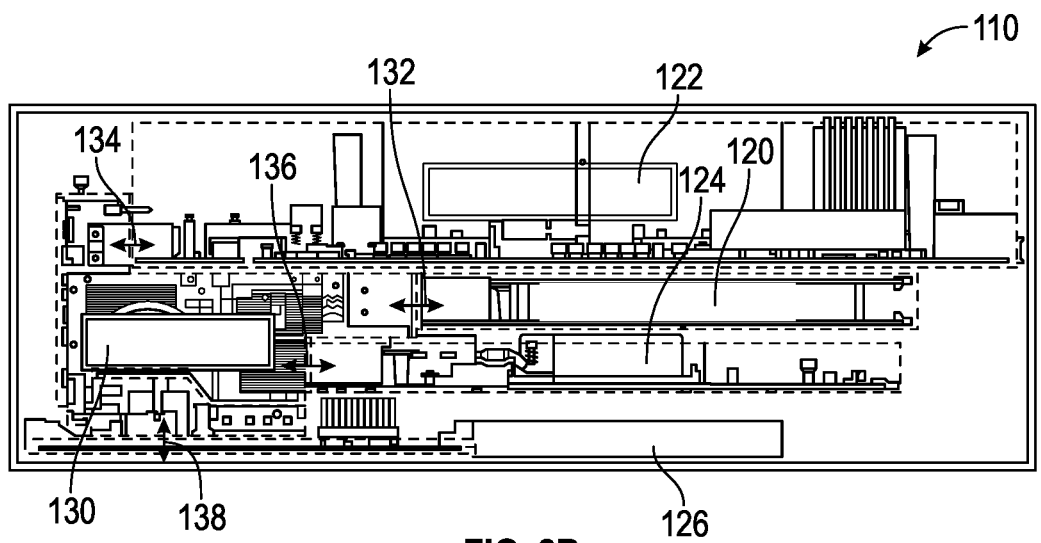
FIG. 2B is a side view of the printed circuit board system that forms the schematic of FIG. 2A.

Referring to FIGS. 2A, 2B, a printed circuit board assembly 110 is shown according to another embodiment. The printed circuit board assembly 110 includes a plurality of printed circuit board assemblies (PCBA) 120, 122, 124 and 126, and a connecting module 130. The printed circuit board assembly 120 is an input/output board, the printed circuit board assembly 122 is a graphics processing unit (GPU) board, the printed circuit board assembly 124 is a mother board, and the printed circuit board assembly 126 is a power distribution board (PDB). The printed circuit board assemblies 120, 122, 124 and 126 function in a similar manner as the printed circuit board assemblies 20, 22, 24 and 26, respectively discussed above. The connecting module 130 functions in a similar manner as the connecting module 30 discussed above. The connections between the plurality of printed circuit board assemblies (PCBA) 120, 122, 124 and 126, and a connecting module 130 are accomplished by connections 132, 134, 136, 138 as shown in FIGS. 2A, 2B that provide the signal routes.

Figure 3:
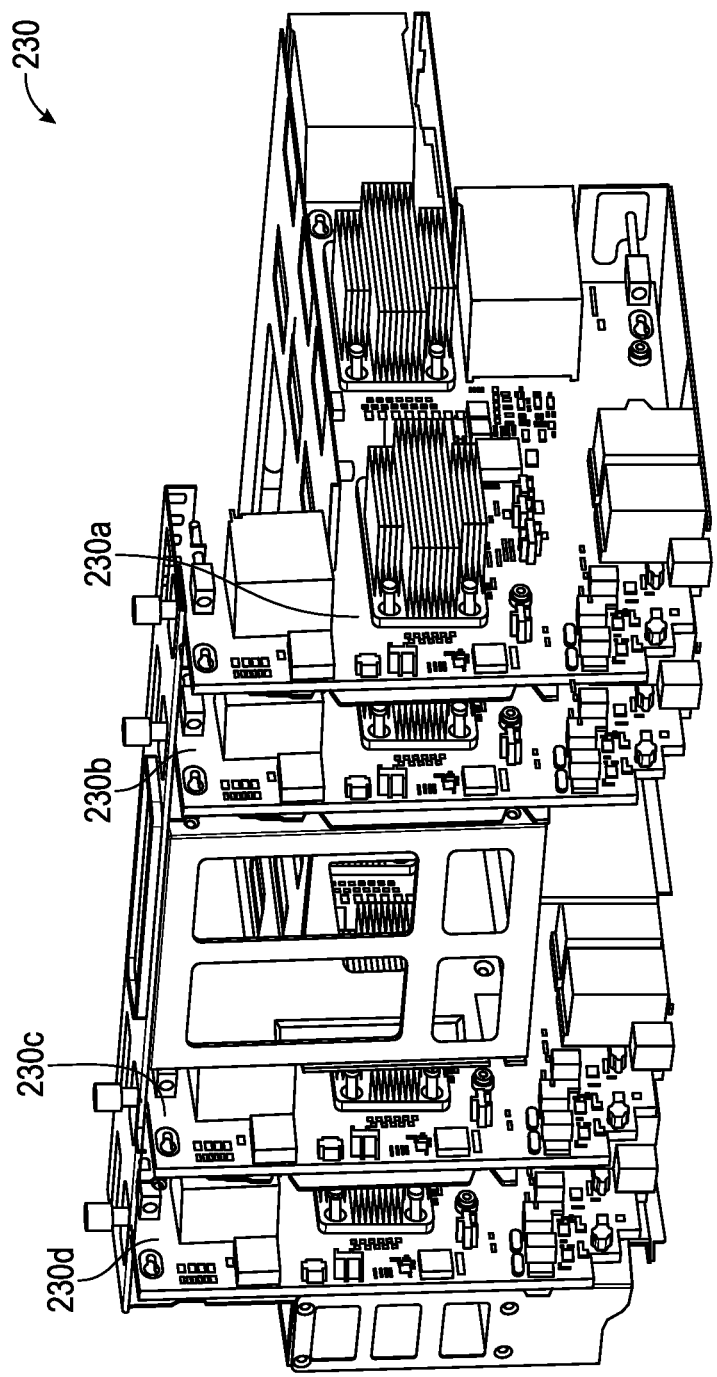
FIG. 3 is a side perspective view of a connecting module according to one embodiment.

Referring to FIG. 3, a connecting module 230 is shown according to another embodiment. The connecting module 230 of FIG. 3 is shown as being formed and subsequently assembled by multiple pieces or portions. Specifically, the connecting module 230 includes a first piece or portion 230a, a second piece or portion 230b, a third piece or portion 230c, and a fourth piece or portion 230d.

The connecting module is formed from at least two pieces or portions. In another embodiment, a connecting module is formed from at least three pieces or portions. In another embodiment, a connecting module is formed from at least four pieces or portions. The connecting module is generally formed from 2 to about 10 pieces or portions and, more typically, formed from 3 to about 6 pieces or portions.

Figure 4:
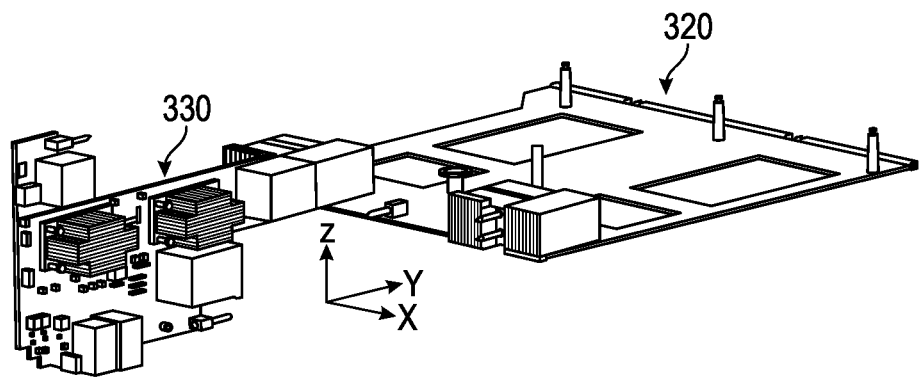
FIG. 4 is a side perspective view of a connecting module and an input/output board according to one embodiment.
Figure 5:
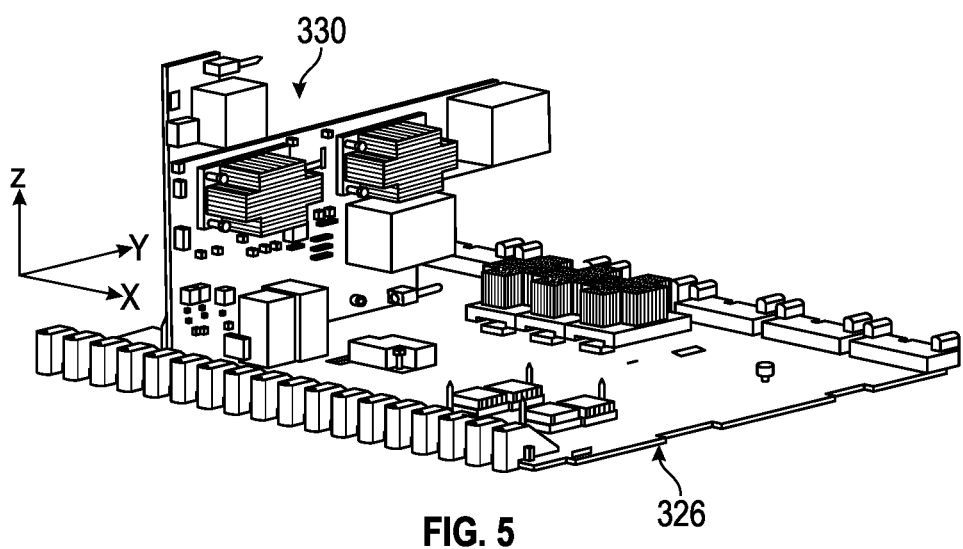
FIG. 5 is a side perspective view of the connecting module of FIG. 4 and a power distribution power board, according to one embodiment.

Referring to FIGS. 4 and 5, a connecting module 330 is connected to a printed circuit board assembly. Referring specifically to FIG. 4, the connecting module 330 is shown connected to a printed circuit board assembly 320, which is an input/output board. As can be seen in FIG. 4, the printed circuit board assembly 320 is on a X-Y plane, while the connecting module 330 is on a Y-Z plane. Referring to FIG. 5, the connecting module 330 is shown with a printed circuit board assembly 326, which is a power distribution board (PDB). As can be seen in FIG. 5, the printed circuit board assembly 326 is on a X-Y plane, while the connecting module 330 is on a Y-Z plane. Thus, the connecting module and the respective printed circuit board assemblies do not need to be on the same plane. By being on different planes, the connecting module can desirably be connected to more printed circuit board assemblies.

Figure 6:
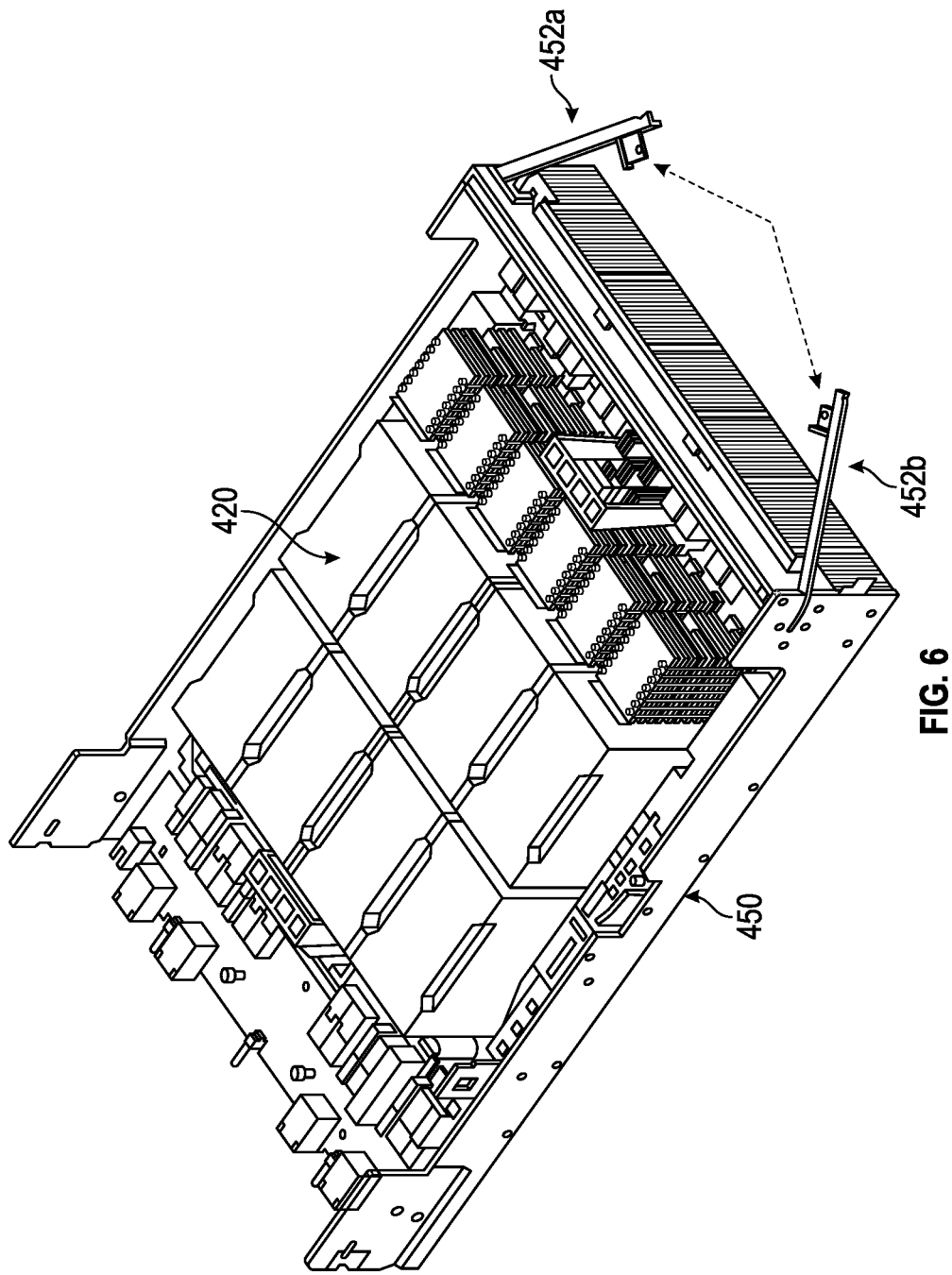
FIG. 6 is a top perspective view of a printed circuit board assembly after being inserted into a tray, according to one embodiment.

Referring to FIG. 6, a process of inserting a printed circuit board assembly into a tray is shown. More specifically, a printed circuit board assembly 420 is shown contained with a tray 450. The tray 450 includes a plurality of levers 452a, 452b.

Figure 7A:
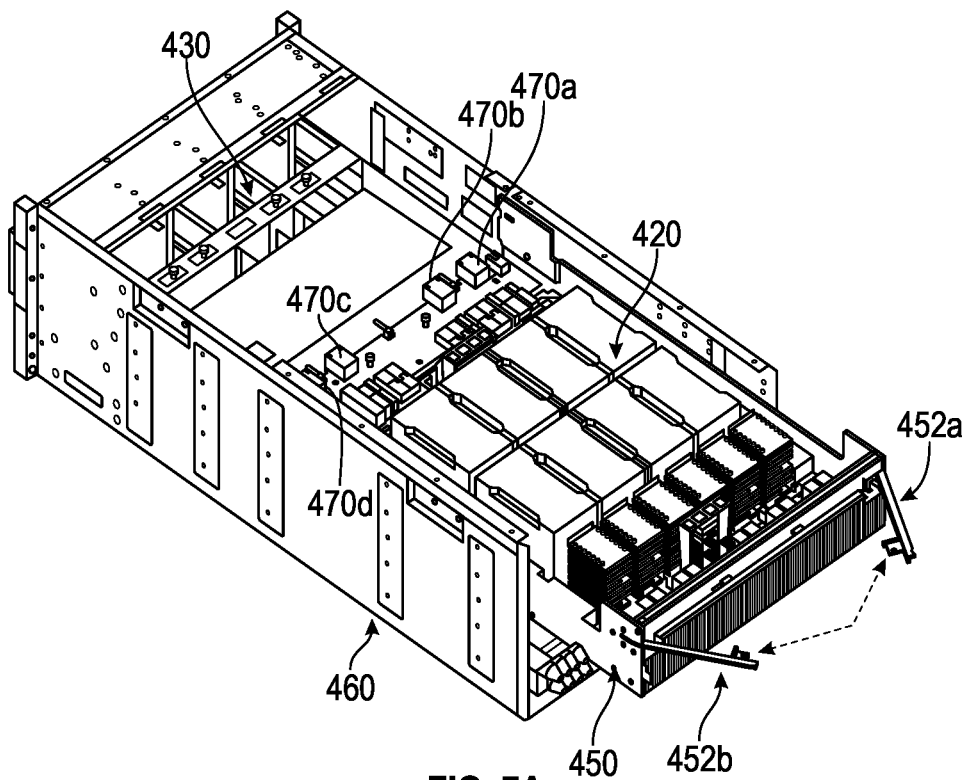
FIG. 7A is a top perspective view of a connecting module and a printed circuit board assembly within a tray before docking, according to one embodiment.
Figure 7B:
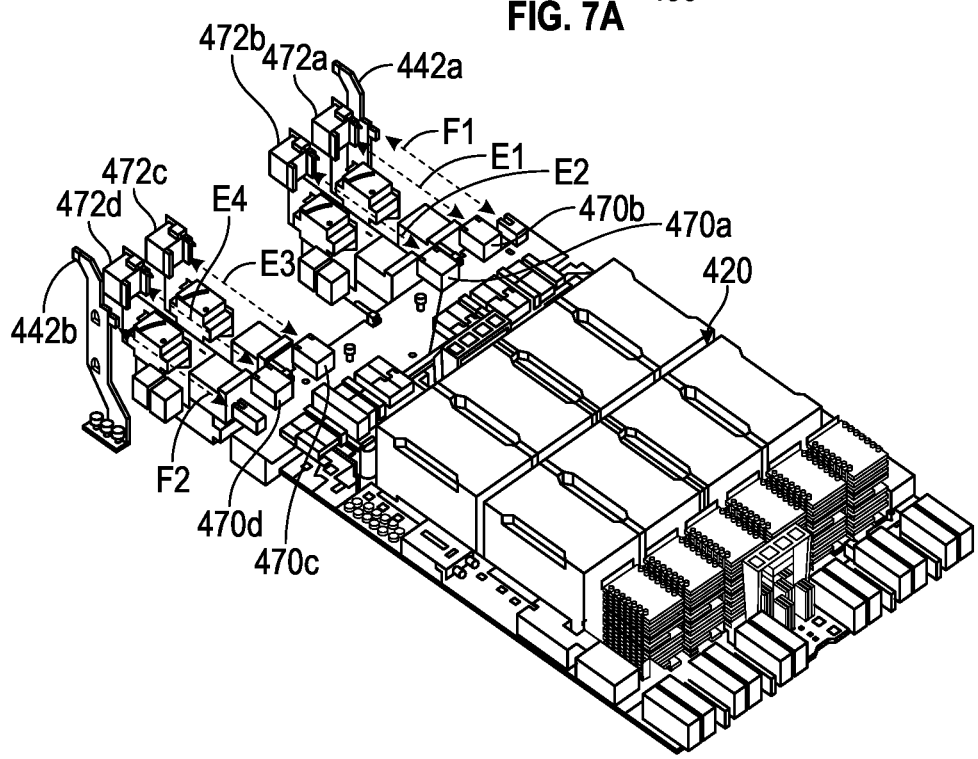
FIG. 7B is a top perspective view of the connecting module and the printed circuit board assembly of FIG. 7A without showing the tray.

Referring to FIGS. 7A, 7B after the printed circuit board assembly 420 is contained within the tray 450, the printed board circuit board assembly 420 is placed into a chassis 460. The printed circuit board assembly 420 includes a plurality of guides pins 470a-d that are aligned with components 472a-d in a connecting module 430. Each of the components 472a-d form a plurality of apertures for receiving the respective guide pins 470a-d.

To better illustrate the printed circuit board assembly 420 and the connecting module before docketing, FIG. 7B is shown in the absence of the chassis 460 and the tray 450. The connecting module 430 includes a plurality of bus bars 442a, 442b, which assist in carrying amounts of current. The bus bars 442, 442b are typically made of copper or aluminum. Signal connection arrows E1-E4 are shown to indicate which components are connected to provide signals after docketing. Power connection arrows F1-F2 are shown to indicate which components are connected to provide power after docketing.

Figure 8A:
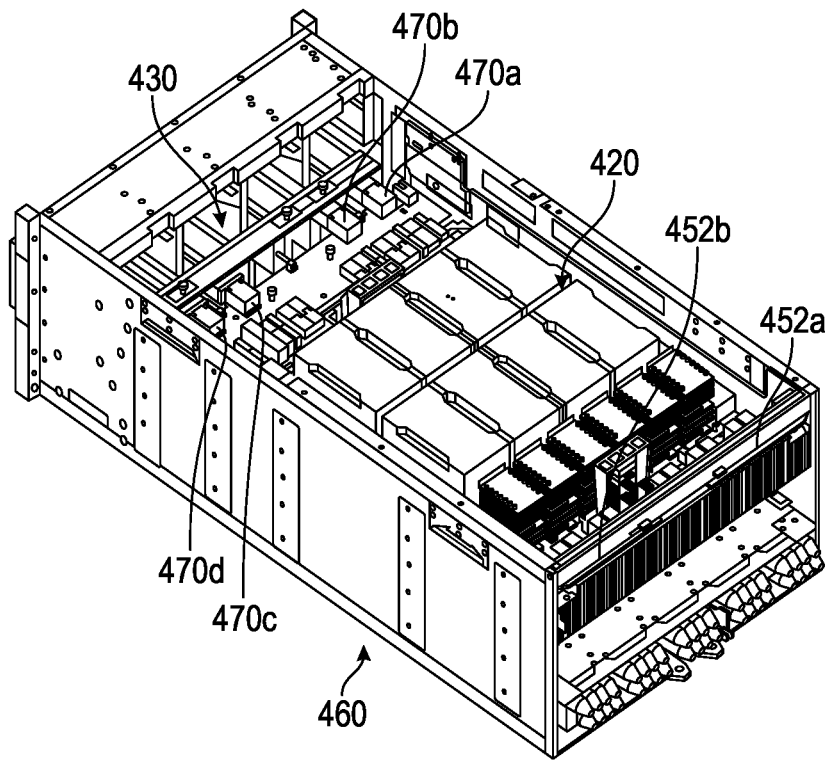
FIG. 8A is a top perspective view of the connecting module and the printed circuit board assembly within the tray of FIG. 7A after docking, according to one embodiment.
Figure 8B:
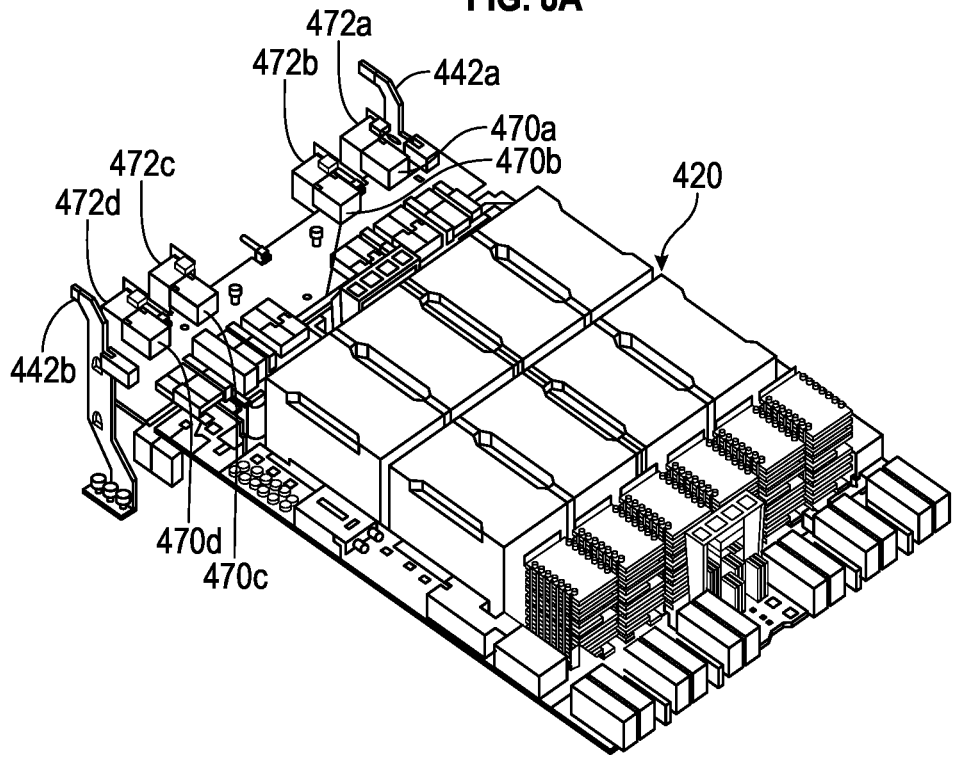
FIG. 8B is a top perspective view of the connecting module and the printed circuit board assembly of FIG. 8A without showing the tray.

FIGS. 8A, 8B, depict the printed circuit board assembly 420 and the connecting module 430 after docketing. To better illustrate the printed circuit board assembly 420 and the connecting module 430 after docketing, FIG. 8B is shown in the absence of the chassis 460 and the tray 450. FIG. 8B shows a plurality of power connections and a plurality of power connections that are formed after docketing.

The printed circuit board systems of the present application are advantageous in several respects. The printed circuit board systems typically have better performance in an air cooling system because of improved air flow. The air flow is improved because of the connecting module that improves the air flow as compared to a number of cables that block the air flow.

The printed circuit board systems also provide a quicker service when replacing one or more of the printed circuit board assemblies. More specifically, the printed circuit board assemblies can be released quickly from the connecting module and then re-installed quickly to the connecting module during servicing. This is much quicker than using cables with a plurality of printed circuit board assemblies.

Figure 9:
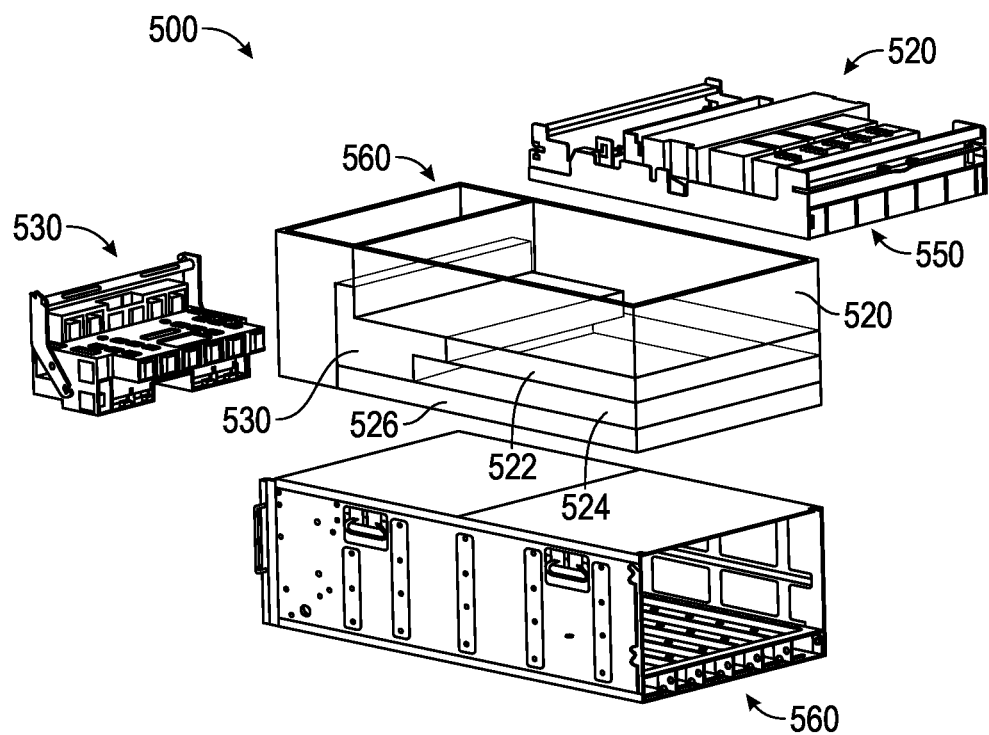
FIG. 9 is an isometric view that shows a housing or chassis that includes a printed circuit board assembly in a tray and a connecting module according to one embodiment.

Referring to FIG. 9, a computer system 500 is shown that includes a housing or chassis 560. The housing 560 includes printed circuit board assemblies 520, 522, 524, 526 contained within a tray 550. The tray 550 contains and secures the printed circuit board assembly 520 and a connecting module 530.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A printed circuit board system comprising: a plurality of printed circuit board (PCB) assemblies that includes at least three PCB assemblies; and a connecting module coupled to each of the PCB assemblies, the connecting module providing electrical and signal communications between each of the PCB assemblies; wherein the connecting module is on different planes with respect to at least one of the PCB assemblies, wherein the plurality of PCB assemblies are located on opposite sides of the connecting module, wherein the connecting module has a thickness that varies at three different areas, wherein at least three lengths of the plurality of PCB assemblies are different from the other lengths of the plurality of PCB assemblies, and the plurality of PCB assemblies on each side of the connecting module is coplanar.

2. The printed circuit board system of claim 1, wherein the plurality of PCB assemblies is at least four PCB assemblies.

3. The printed circuit board system of claim 1, wherein the plurality of PCB assemblies is from about 3 to about 10 PCB assemblies.

4. The printed circuit board system of claim 3, wherein the plurality of PCB assemblies is from about 3 to about 6 PCB assemblies.

5. The printed circuit board system of claim 1, wherein the plurality of PCB assemblies includes an input/output board, a mother board, a power distribution board, and a graphics processing unit.

6. The printed circuit board system of claim 1, wherein the connecting module is formed from at least two pieces.

7. The printed circuit board system of claim 6, wherein the connecting module is formed from at least three pieces.

8. A computer system comprising: a housing; and at least one tray contained within the housing, wherein the tray includes a plurality of printed circuit board (PCB) assemblies that includes at least three PCB assemblies, and a connecting module coupled to each of the PCB assemblies, the connecting module providing electrical and signal communications between each of the PCB assemblies, the connecting module being on different planes with respect to at least one of the PCB assemblies, wherein the plurality of PCB assemblies are located on opposite sides of the connecting module, wherein the connecting module has a thickness that varies at three different areas, wherein at least three lengths of the plurality of PCB assemblies are different from the other lengths of the plurality of PCB assemblies, and the plurality of PCB assemblies on each side of the connecting module is coplanar.

9. The computer system of claim 8, wherein the computer system is a server.

10. The computer system of claim 8, wherein the plurality of PCB assemblies is from about 3 to about 10 PCB assemblies.

11. The computer system of claim 8, wherein at least one length of the plurality of PCB assemblies is different from the other length or lengths of the plurality of PCB assemblies.

12. The computer system of claim 8, wherein the plurality of PCB assemblies includes an input/output board, a mother board, a power distribution board, and a graphics processing unit.

13. The computer system of claim 8, wherein the connecting module is formed from at least two pieces.

14. The computer system of claim 13, wherein the connecting module is formed from at least three pieces.

* * * * *